– – – – – – – –

United States Patent [19]

Parekh

[11] 4,395,725

[45] Jul. 26, 1983

[54] SEGMENTED CHANNEL FIELD EFFECT TRANSISTORS

[76] Inventor: Rajesh H. Parekh, 425 Gwinn Ct., San Jose, Calif. 95111

[21] Appl. No.: 196,384

[22] Filed: Oct. 14, 1980

[51] Int. Cl.³ .................... H01L 29/06; H01L 29/78
[52] U.S. Cl. ................................... 357/23; 357/20; 357/89
[58] Field of Search ............. 357/23 VT, 89, 23 VD, 357/23 D, 20

[56] References Cited

U.S. PATENT DOCUMENTS

| | | | |
|---|---|---|---|
| 4,011,576 | 3/1977 | Uchida et al. | 357/23 VT |
| 4,101,921 | 7/1978 | Shimada et al. | 357/23 VT |
| 4,145,233 | 3/1979 | Sefick et al. | 357/23 D |
| 4,198,252 | 4/1980 | Hsu | 357/23 VT |
| 4,233,616 | 11/1980 | Kyomasu et al. | 357/23 VT |
| 4,242,691 | 12/1980 | Kotani et al. | 357/89 X |

OTHER PUBLICATIONS

K. N. Ratnakamar et al., "Performance Limits of E/D NMOS VLSI", *IEEE International Solid-State Circuits Conference*, (1980) pp. 72-74.

T. Ito et al., "Thermal Nitride Gate FET Technology for VLSI Devices", *IEEE International Solid-State Circuits Conference*, (1980), pp. 74-75.

*Primary Examiner*—James W. Davie
*Assistant Examiner*—J. Carroll
*Attorney, Agent, or Firm*—Linval B. Castle

[57] ABSTRACT

A method for the fabrication of field effect transistors with conduction channels divided into a plurality of segments, each implanted to conduct at various threshold voltages. Field effect transistors, heretofore essentially digital switching devices, may thus be fabricated for use in circuits wherein variations in applied gate voltages can result in three or more stable current levels or transistors may be designed to provide various electrical output characteristics such as that required for analog circuits, fast EPROMs, high density ROMs, etc.

3 Claims, 16 Drawing Figures

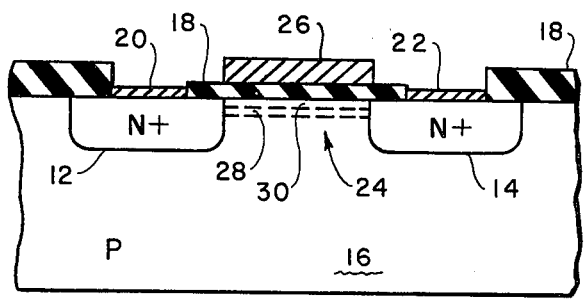
FIG. 1
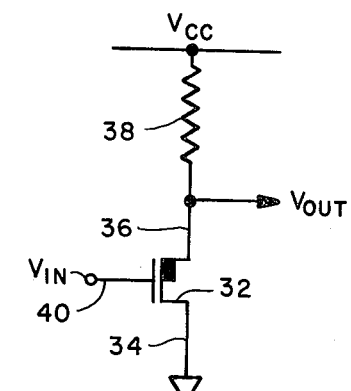
FIG. 3
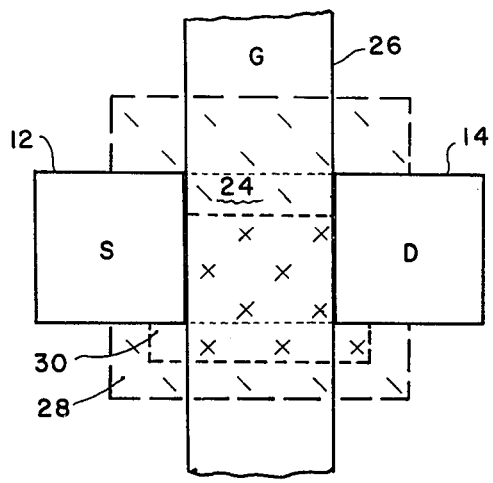
FIG. 2
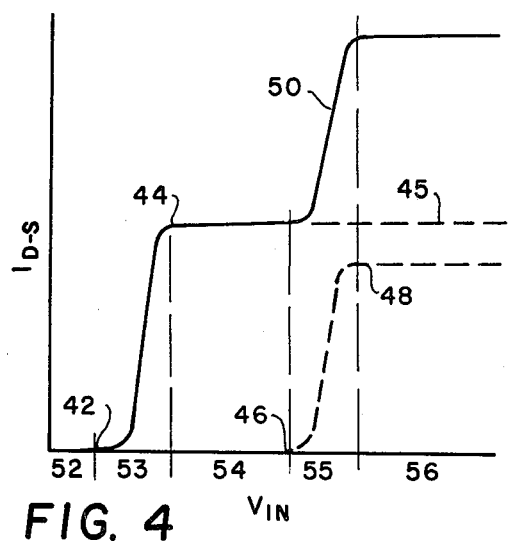
FIG. 4
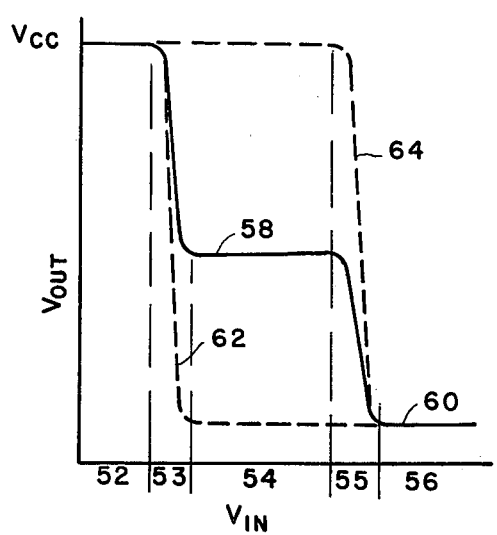
FIG. 5
| $V_{IN}$ | SEG. 28 | SEG. 30 | CURVE REF. | $V_{OUT}$ |
|---|---|---|---|---|
| 0→1. | OFF | OFF | 52 | HIGH |
| 1.→1+ | SWITCH | OFF | 53 | HI→INT. |
| 1+→4. | ON | OFF | 54 | INT. |
| 4.→4+ | ON | SWITCH | 55 | INT.→LO |
| OVER 4+ | ON | ON | 56 | LOW |
FIG. 6

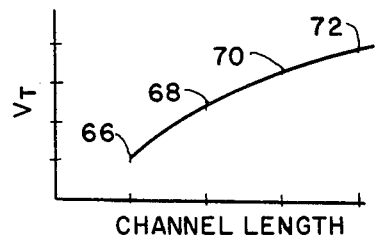
FIG. 7
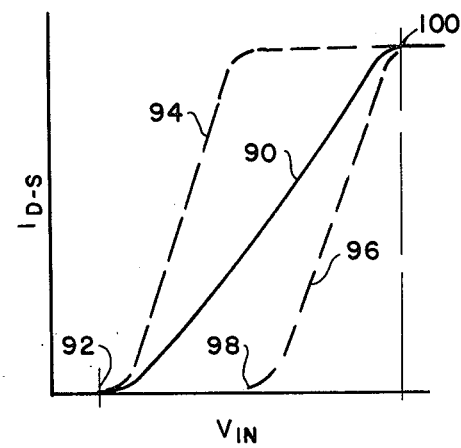
FIG. 11
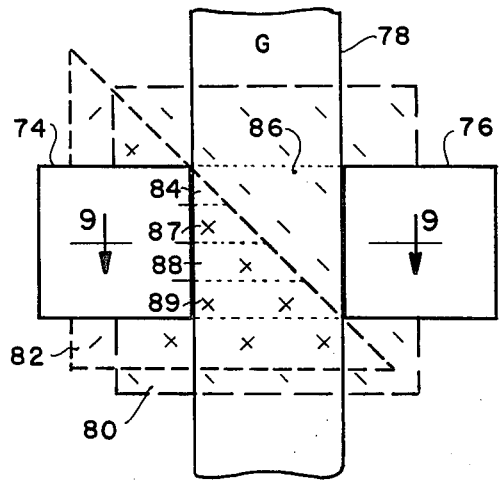
FIG. 8
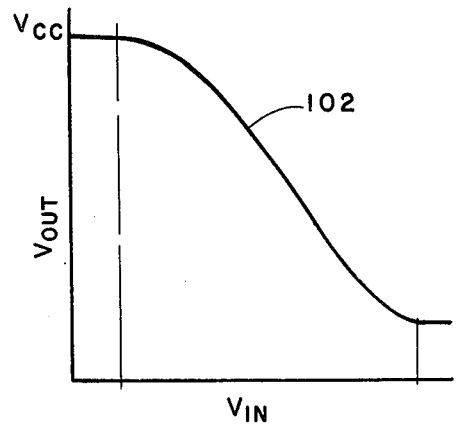
FIG. 12
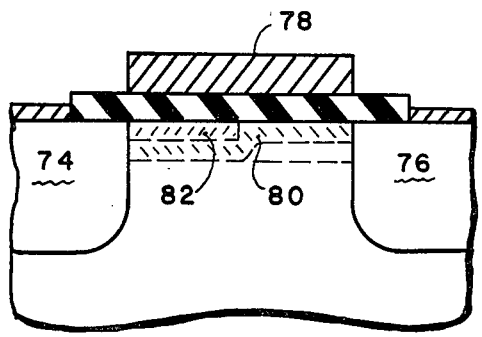
FIG. 9
| SEGMENT PORTION | 84 | 87 | 88 | 89 |
|---|---|---|---|---|
| AVERAGE CHANNEL LENGTH | 1 | 2 | 3 | 4 |
| TYPICAL $V_T$ | 1.0 | 2.5 | 3.5 | 4.0 |
FIG. 10

SEGMENTED CHANNEL FIELD EFFECT TRANSISTORS

BRIEF SUMMARY OF THE INVENTION

This invention relates generally to field effect transistors (FET) and in particular to the fabrication of novel transistors having conducting channels that are segmented and implanted to conduct at various threshold voltages to produce desired and unique electrical output characteristics.

Conventional FETs are essentially binary devices because very small changes of gate voltage at the threshold level will produce large current variations, and it is extremely difficult to predict or control and reproduce a desired electrical characteristic between an On and Off condition. The novel FET described and claimed herein employs two or more adjacent implanted layers or channel segments, each segment providing a different threshold voltage and being configured to generate a specific electrical output characteristic.

For example, an electrical circuit may be required to have three or four stable output states to be used for increasing the capacity of a memory, or the like. A segmented channel field effect transistor (SCFET) may be fabricated with a first implanted layer of conducting channel that conducts at a threshold voltage of perhaps 1.0 volts, a second overlying layer implanted to conduct at perhaps 2.5 volts, and a third implanted layer conductive at a 4.0 volts threshold. As gate voltage is applied and increased, the first channel will conduct a first current, followed at the second threshold level by an additional current through the second segment, and subsequently by a third additional current through the third segment. By appropriate selection of the input gate voltage, one stable zero current level is established up to the threshold of 1.0 volts and increasing current steps are produced by passing the next higher threshold levels. Such a multi-threshold SCFET may readily be adapted to appropriate circuits such as READ ONLY memories where it may be desired that each memory location stores a plurality of states depending upon the applied gate input voltage. A multi-threshold SCFET may be designed for fast EPROM applications with one segment having a high threshold for high programmability and a second low threshold segment for high speed.

In other configurations, a first segment may bridge the channel between the source and drain pockets of an SCFET and may conduct at a threshold voltage of perhaps 1.0 volt. A second segment having a triangular shape and providing conduction at 4.0 volts may be implanted diagonally across the channel so that it tapers from a full channel width at the source pocket to a zero width at the drain pocket. It has recently been discovered (see February 1980 proceedings of the IEEE International Solid State Circuits Conference, Page 73, FIG. 3 and Page 75, FIG. 4) that, with very short channels, a sub-threshold conduction takes place. Therefore, an implanted impurity designed to provide channel conduction at one fixed threshold voltage will actually conduct at various lower threshold voltages that depend upon the actual length of the short channel. In the configuration employing a triangular implant segment with a 4.0 volts threshold over a fully implanted segment with a 1.0 volt threshold, a low current will be conducted through the SCFET at the 1.0 volt threshold and, as the gate or input voltage is increased, the current will increase nearly linearly up to the 4.0 volts threshold level. By altering the form of the triangular second segment, the output current may be made to be linear with input voltage and, if desired, nearly any other output characteristic may be obtained.

The object of the invention is to provide a means for fabricating a FET having desired and unique electrical output characteristics, such as a transistor with at least three output current levels or transistors with current conduction that may vary linearly or non-linearly, as desired, with applied input gate voltage.

It is apparent that such a transistor that is designed to produce specific output current and desired switching speed characteristics has very high utility. For example, a SCFET may be fabricated for analog applications requiring an output current that varies linearly over a wide range of applied input gate voltages. As previously mentioned, an SCFET may be fabricated for fast EPROM applications with one segment having a high threshold for programability and a second segment with a low threshold for high speed switching. The SCFET may be made with several threshold levels for use in high density PROMs or other applications requiring multi-threshold levels or semi-static/semi-dynamic circuits. Thus, the SCFET may be made to produce output current and speed characteristics specifically designed for its particular application.

DESCRIPTION OF THE DRAWINGS

In the drawings which illustrate embodiments of the invention:

FIG. 1 is a sectional elevation view of a segmented channel field effect transistor illustrating two implanted channel segments;

FIG. 2 is a sectional plan view of the SCFET of FIG. 1;

FIG. 3 is a schematic diagram of an SCFET in a typical inverter circuit;

FIG. 4 is a graph of current versus input voltage of the transistor circuit of FIGS. 1 and 2;

FIG. 5 is a graph of output voltage versus input voltage of the transistor circuit of FIG. 3;

FIG. 6 is a table describing the operation of the graphs of FIGS. 4 and 5;

FIG. 7 is a curve of sub-threshold voltages versus short channel lengths in a field effect transistor;

FIG. 8 is a sectional plan view of a second embodiment of the SCFET illustrating a triangular channel segment that functions in accordance with the characteristics of FIG. 5;

FIG. 9 is a sectional elevation view taken along the lines 9—9 of FIG. 8;

FIG. 10 is a table illustrating typical threshold voltages for various portions of the triangular channel segment of FIG. 8;

FIG. 11 is a curve of current versus input voltages for the SCFET of FIGS. 8 and 9;

FIG. 12 is a curve of output voltage versus input voltage for the transistor of FIGS. 8 and 9 in the inverter circuit of FIG. 3;

DETAILED DESCRIPTION

Figure 13:
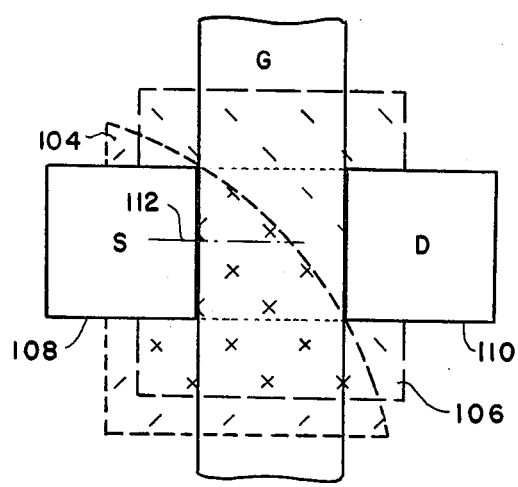
FIG. 13 is a sectional plan view of a SCFET with an arcuate triangular channel segment.

Illustrated in the sectional elevation view of FIG. 1 is an N-channel insulated gate field effect transistor typically having an N+ source pocket 12, and an N+ drain pocket 14 implanted in a P-type substrate 16. Overlying the substrate 16 and the source and drain pockets is a layer of insulation 18, typically silicon dioxide dielectric having suitable openings over the source and drain pockets 12, 14 to provide for the insertion of metal contacts 20 and 22, respectively. A conduction channel 24 bridges the area between the source pocket 12 and the drain pocket 14 beneath the surface of the substrate and the dielectric insulator 18 and immediately above this channel 24 and the overlying gate dielectric is a gate conductor 26.

The component described above is that of a typical insulated gate FET structure. It should be understood that the segmented gate arrangement of the invention is merely being described in connection with such a structure and that the invention may be readily adapted for use in fabricating other field effect devices. Such as N-MOS, P-MOS, C-MOS, H-MOS, SOS, floating gate MOS, etc. Thus, the invention is directed toward the fabrication of transistors with channels designed to provide unusual or desired output characteristics of the transistor.

In the elevation view of FIG. 1, two parallel adjacent layers or segments 28 and 30 are formed in the channel 24 as also illustrated in the simplified plan view of FIG. 2. FIG. 2 illustrates the source pocket 12, and drain pocket 14 separated by a short channel 24 of approximately 1-2 microns in length. The channel segment 28 containing an impurity that determines the channel threshold voltage level is implanted in the top surface of the substrate 16 to completely cover the entire channel 24 between the source 12 and drain 14. Subsequently, a second segment 30 is implanted over and within the first segment 28 over the length of the channel between the source pocket 12 and drain pocket 14 but does not cover the full width of the channel, as illustrated in FIG. 2. The segment 30 therefore contains both the impurity implanted into the lower segment 28 as well as the second implant material. For the purpose of explanation it will be assumed that both the segments 28 and 30 are implanted with an impurity that adjusts the threshold volt-voltage of the transistor at a level of 1.0 volts and the added impurity subsequently injected only into the segment 30 permits the segment 30 to conduct now at a threshold voltage of 4.0 volts. Such selective implantation into the channel area of a transistor is well-known in the present state of the art and is readily accomplished by present day masking techniques.

FIG. 3 is a simple schematic diagram illustrating an SCFET 32 in an inverter circuit with its source conductor 34 coupled to ground and the drain conductor 36 coupled through a suitable pull-up device 38 to a source of D.C. supply voltage $V_{cc}$. The voltage output terminal of the circuit is connected to the drain conductor 36 and a suitable input voltage is applied to the gate conductor 40.

FIG. 4 is a curve of drain-to-source current as a function of input gate voltage of the transistor of FIGS. 1 and 2 in the circuitry of FIG. 3. In the SCFET, it is assumed that segment 28 is implanted to conduct at a threshold voltage of 1.0 volts, indicated by the reference numeral 42 of FIG. 4. As increased gate voltage is applied to the input conductor 40 of FIG. 3, the channel formed by the segment 28 conducts current up to its maximum current level 44, at which point it substantially levels off as indicated. As the gate voltage is further increased, the current passing through the segment 28 may remain substantially constant as shown by the reference numeral 45. However, channel 30 will become conductive at the threshold level of 4 volts as indicated by the reference numeral 46 and further increase in gate voltage will produce a current level of the segment 30 to a substantially constant level indicated by the reference numeral 48. At this point, the two segments 28 and 30 in the channel 24 are both conducting currents so that the total drain current becomes the sum of these two currents as indicated by the two-step curve 50. Thus, the SCFET of FIGS. 1 and 2 in the circuitry of FIG. 3 produces an output having three stable states: One state occurring below the 1.0 volt threshold of the layer 28 as indicated by the reference numeral 52; a second state existing between 1.0 volts and 4.0 volts as indicated by the reference numeral 54; and a third state existing above 4.0 volts as indicated by the reference numeral 56. It will obviously be understood that the various voltage levels mentioned herein are illustrative only and that various well known impurity implants may be used to provide various threshold voltages and various output characteristics. Some implanted impurities operate to increase a threshold voltage whereas others operate to decrease a threshold voltage so that the impurities applied to the various segments in the channel may be selected to provide the desired characteristics.

FIG. 5 is a graph illustrating output voltage versus input voltage of the circuitry of FIG. 3. It will be noted that the reference numerals 52-56 are employed in both FIGS. 4 and 5 and are intended to represent corresponding input voltages. Thus, below the lowest threshold voltage level of the transistor 32 of FIG. 3, there is no IR drop through the resistance 38 and the output is at the level of the circuit voltage source $V_{cc}$. When the segment 28 first conducts at its assumed threshold of 1.0 volts a rapid current switching takes place as illustrated by the reference numeral 53 of FIG. 4. The presence of the implanted material in the segment 28 limits the current through that segment to the level indicated by the reference numeral 45 in FIG. 4 and the IR drop through the resistance 38 of FIG. 3 will produce an output voltage level indicated by the reference numeral 58 of FIG. 5. As the input gate voltage is further increased within the area indicated by the reference numeral 54 of FIGS. 4 and 5, the threshold point 46 of the parallel channel segment 30 is reached and a rapid switching takes place as indicated by the reference numeral 55. When the current has reached its maximum produced by the two parallel channels 28 and 30, a maximum voltage drop occurs across the resistance 38 and the output voltage drops to its lowest level as indicated by the reference numeral 60 of FIG. 5. In FIG. 5, the dashed line 62 is included to indicate the threshold switching of the segment 28 and the dashed line 64 indicates the threshold switching of the parallel segment 30.

FIG. 6 is a table indicating the various conditions of the segments 28 and 30, the areas of the curves of FIGS. 4 and 5, and the various output voltage levels for varying input voltages. Thus, between the input voltages of 0 and 1.0 volts, segment 28 and segment 30 are non-conductive as indicated by the curve reference numeral 52 and the output voltage is high as indicated in FIG. 5. Above 1.0 volts, segment 28 is switching while segment 30 is still non-conductive as indicated by the reference numeral 53 and the output voltage is varying rapidly between its high $V_{cc}$ level and its intermediate state as indicated by the reference numeral 58 of FIG. 5. Between 1 and 4 volts, segment 28 is on, segment 30 still remains non-conductive as indicated by the numeral 54 of FIGS. 4 and 5 and the output voltage is intermediate as indicated by the reference numeral 58 of FIG. 5. Slightly above 4 volts, the segment 30 switches as indicated by the numeral 55 of the figures and the output voltage varies between its intermediate level 58 and its low level 60. Above 4 volts, both of the segments 28 and 30 are conducting in parallel and, as indicated by the reference numeral 56, the output voltage is at its lowest level.

FIG. 7 is a curve of threshold voltage as a function of very short channel lengths. As previously mentioned, in field effect transistors with very short channels such as those extensively employed in the fabrication of integrated circuits, it has recently been discovered that an implanted channel impurity designed to establish a predetermined fixed threshold voltage will actually exhibit sub-threshold or early conduction characteristics depending upon the length of that very short channel. The curve of FIG. 7 illustrates variations in threshold voltage for variations in short channel lengths. Thus, for extremely short lengths, e.g., 0.25 microns, the threshold voltage may be greatly reduced and, for illustrative purposes only, a channel implanted to conduct at 4.0 volts may have a minimum threshold level of 1.0 volts at the point indicated by the reference numeral 66. If this extremely short channel length is doubled, the threshold level may jump to a level of 2.5 volts as indicated by the reference numeral 68. Another unit of channel length may produce a threshold level of 3.5 volts as indicated by the numeral 70 and a channel length of four units, e.g., 0.6 microns may produce a threshold voltage of 4.0 volts as indicated by the reference numeral 72. All of these variations occur with one type of implanted impurity which may produce a constant threshold voltage of 4.0 volts if it extended over the entire length of the conduction channel between source and drain pockets of the transistor.

FIG. 8 is a sectional plan view of an SCFET that employs a channel segment of varying length and therefore varying sub-threshold levels as explained in connection with FIG. 7. The SCFET of FIG. 8 includes a source pocket 74, a drain pocket 76, and a gate conductor 78 as did the transistor of FIGS. 1 and 2. Also as in FIG. 2, the transistor of FIG. 8 has a segment 80 that is implanted across the entire channel to provide current conduction at a threshold voltage of 1.0 volts. A second segment 82 is implanted into the segment 80 and is configured in the form of a triangle that extends the entire width of the channel at the end adjacent the source pocket 74 and which tapers to a zero width where the segment 82 contacts the drain pocket 76. This triangular segment 82 within the channel operates in accordance with the curve of FIG. 7. At the one point in the conduction channel where the triangular segment 82 enters the channel at the top of the short segment portion 84, only the low threshold voltage segment 80 may become conductive. Where the channel length of the triangular segment 82 is very short, for example at the average length of the segment portion 84, the threshold voltage of the segment 82 is low and may correspond to the point 66 of FIG. 7 to thereby conduct at a low threshold level and provide a small current in addition to that flowing through the segment 80 between the pockets 74 and 76 at the top or apex of the segment portion 84. As the input gate voltage is increased, additional adjacent portions of the triangular segment 82 become conductive and the current flow across the channel 86 will increase to the point where the maximum threshold voltage of 4.0 volts is eventually reached. Again it must be understood that the voltage levels mentioned are for illustrative purposes only.

FIG. 9 is a sectional elevation view of a portion of the transistor of FIG. 8 and taken along the lines 9—9 of that figure. FIG. 9 is presented to better illustrate the sectional elevation view of the segments 80 and 82 at the mid-point of the channel 86 and between the segment portions 87 and 88 of FIG. 8. As illustrated in FIG. 9, the segment 80 bridges the entire conduction channel length between the source and drain pockets 74 and 76. Subsequent to the implanting of the segment 80, a second implant was made to form the triangular segment 82 which, as illustrated in FIG. 9, covers only one-half the channel length at the mid-point of the channel between portions 87 and 88.

FIG. 10 is a table illustrating average channel lengths of the segment portions 84–89 of FIG. 8 and the corresponding typical threshold voltages for each portion. It will be noted that the results indicated in FIG. 10 closely correspond with a plotted curve of FIG. 7 and FIG. 10 is presented to illustrate that each of the channel portions 84, 87, 88, 89 of FIG. 8 linearly increase in average length whereas the typical threshold voltage correspondingly increases but not linearly.

FIG. 11 is a curve of drain-to-source current versus input gate voltage for the SCFET of FIG. 8 in a circuit similar to that of FIG. 3. The solid line curve 90 of FIG. 11 represents the total drain current for the transistor and illustrates the initiation of current flow at the first threshold level 92. If only the segment 80 had been included in the transistor of FIG. 8 and the triangular section 82 had been omitted, the response curve would have followed the dashed line 94 of FIG. 11 and there would be a rapid switching action of the transistor. The current flow of only a full conduction channel of only the implanted material of the triangular segment 82 is illustrated by the dashed line 96 which begins conduction at a level indicated by the numeral 98 and reaches maximum current conduction at the 4.0 volt threshold level indicated by the reference numeral 100. It will be observed that the overall current characteristic of the combination illustrated in FIG. 8 and which is indicated by the curve 90 is a gradual, nearly linear, function and by proper control of the input gate voltage, an SCFET exhibiting these characteristics may be used as an analog MOS transistor for linear amplifiers or drivers, or the like.

FIG. 12 is a curve of output voltage versus input gate voltage for the transistor of FIG. 8 in the circuitry illustrated in FIG. 3. The curve 102 of FIG. 12 is a plot of the product of current, from curve 90 of FIG. 11, and the value of the pull-up resistance 38 of FIG. 3 versus the input gate voltage.

FIG. 13 is a sectional plan view of still another embodiment of an SCFET which is quite similar to that illustrated in FIG. 8 except for the arcuate triangular segment 104 that diagonally bridges the length of the conducting channel. As in the case of FIG. 9, a segment 106 extends over the entire length and width of the conduction channel and the triangular segment 104 extends across the entire width at the source pocket 108 and has a zero width where it contacts the drain pocket 110. However, in the SCFET of FIG. 13, the arcuate triangular line across the channel extends the length of the channel so that the length of the conduction segment 104 along the center line 112 of the channel will be longer than the center line length of the corresponding part 82 in the SCFET of FIG. 8. According to the curve of FIG. 7, this will increase the threshold voltage at the center line 112 with the result of a lower current across the channel at a corresponding input gate voltage. This arcuate concavity of the triangular segment 104 tends to produce a more linear output as indicated in the voltage characteristics curve of FIG. 14.

Figure 14:
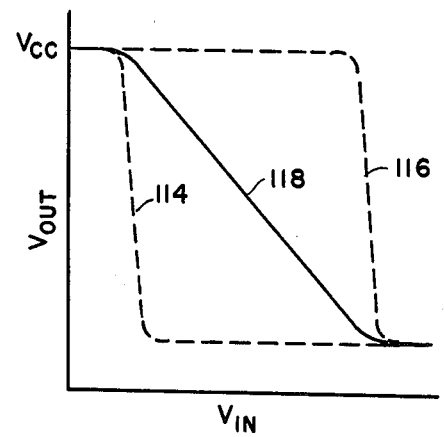
FIG. 14 is a curve illustrating the linear output characteristics of the SCFET of FIG. 13.

In FIG. 14, the dashed line 114 represents the voltage output characteristics if only the lower threshold voltage segment 106 of FIG. 13 occupied the conduction channel, whereas the dashed line 116 represents the output characteristics if the entire channel were implanted with the higher threshold material such as that contained in the triangular segment 104. It will be noted from FIG. 14 that the voltage output curve 118 representing the arcuate triangular segment 104 is linear over a long range of input gate voltages. A transistor having this output characteristic can therefore be used for various analog applications, such as linear amplifiers, or the like.

Figure 15:
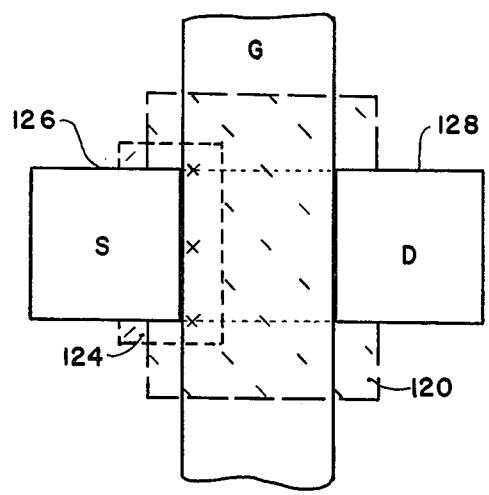
FIG. 15 illustrates still another embodiment of the SCFET having a small rectangular conducting channel for providing a unique output characteristic.
Figure 16:
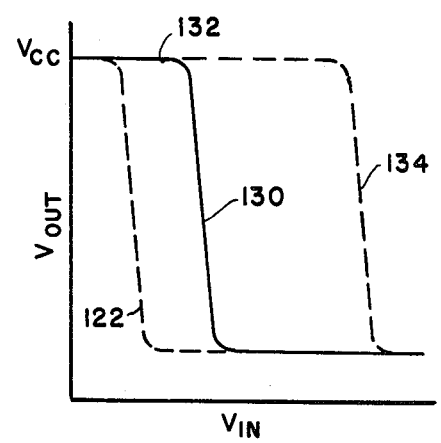
FIG. 16 is a curve illustrating the output voltage characteristics of the SCFET of FIG. 15.

FIG. 15 is a plan view illustrating still another embodiment designed to produce a particular output characteristic shown in FIG. 16. In the transistor of FIG. 15, a segment 120 implanted with an impurity that produces a threshold voltage of, for example, 1.0 volts extends across the entire length and width of the conduction channel of the SCFET so that variations in the input gate voltage produce an output voltage indicated by the curve 122 of FIG. 16. A second segment 124 implanted with an impurity that would normally produce a threshold voltage of 4.0 volts extends across the entire channel width adjacent the source pocket 126 but only extends approximately one-quarter into the length of the channel toward the drain pocket 128. This portion of the segment 124 extending into the channel represents a very short channel length in series with the low threshold conduction segment 120 and the total series conduction of the two segments produce voltage output characteristics illustrated by the curve 130 of FIG. 16. It will be noted that in the embodiment illustrated in FIG. 15, the segments 120 and 124 are effectively in series. The segment 124 isolates the segment 120 from the source pocket 126 to thereby prevent conduction between source 126 and drain pocket 128 until the sub-threshold level of the short segment 124 has been reached as indicated by the reference numeral 132 of FIG. 16. As previously mentioned, the dashed line 122 of FIG. 16 represents the characteristics of only the segment 120 without the presence of the short segment 124. Similarly, the dashed curve 134 would normally represent the output characteristics of only the segment 124 if it bridged the entire length of the channel. However, because segment 124 is short and therefore follows the sub-threshold characteristics previously described in connection with FIG. 7, channel conduction will occur at some point between the dashed lines 122 and 134 of FIG. 16 and depending upon the distance that the short segment 124 extends into a combination channel.

By the use of such segmented channels in a field effect transistor it is apparent that virtually any desired output characteristic may be obtained. For simplicity, the foregoing description has described the invention in connection with a typical N-channel MOS field effect transistor and only two conducting channel segments have been described. It should be understood that the invention may be used with other types of field effect devices and also that various segment configurations as well as additional segments may be used to achieve the desired electrical output characteristics.

Having thus described my invention, what is claimed is:

1. A segmented channel field effect transistor including a substrate, separated source and drain pockets adjoining one surface of said substrate, a current conduction channel bridging the separation between said source and drain pockets and having a length corresponding to said separation and a width corresponding to the widths of said source and drain pockets adjacent said conduction channel, and a gate element overlying said channel and electrically insulated therefrom, the current conduction channel of said transistor having therein a plurality of segments each implanted to conduct at a unique threshold voltage, at least one of said plurality of segments bridging the width of said channel adjacent one of said pockets and narrowing in width as said segment extends along the length of said channel.

2. The segmented channel field effect transistor claimed in claim 1 wherein a first one of said plurality of segments bridges the length and width of said current conduction channel and a second one of said plurality has a substantially triangular configuration one leg of which bridges the width of said channel adjacent one of said source and drain pockets, said second segment narrowing in width as it extends through the length of said channel.

3. The segmented channel field effect transistor claimed in claim 2 wherein said triangular second segment has a maximum width adjacent a first one of said source and drain pockets at a first end of said conduction channel the width of said second segment narrowing to a zero width at the second end of said channel adjacent the second one of said pockets.

* * * * *